United States Patent
Kim et al.

(10) Patent No.: US 8,039,294 B2
(45) Date of Patent: Oct. 18, 2011

(54) INSULATING LAYER, ORGANIC THIN FILM TRANSISTOR USING THE INSULATING LAYER, AND METHOD OF FABRICATING THE ORGANIC THIN FILM TRANSISTOR

(75) Inventors: Gi Heon Kim, Daejeon (KR); Sung Min Yoon, Daejeon (KR); Kyu Ha Baek, Daejeon (KR); In Kyu You, Daejeon (KR); Seung Youl Kang, Daejeon (KR); Seong Deok Ahn, Daejeon (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1118 days.

(21) Appl. No.: 11/782,889

(22) Filed: Jul. 25, 2007

(65) Prior Publication Data
US 2008/0063795 A1    Mar. 13, 2008

(30) Foreign Application Priority Data
Sep. 11, 2006  (KR) .................. 10-2006-0087258

(51) Int. Cl.
*B05D 3/00*  (2006.01)

(52) U.S. Cl. ............... 438/99; 257/E51.001; 427/385.5; 427/487

(58) Field of Classification Search ............... 257/40, 257/E51.001–E51.052; 438/99; 427/487–522, 427/372.2, 374, 385.5, 393.5
See application file for complete search history.

(56) References Cited

U.S. PATENT DOCUMENTS

| | | | |
|---|---|---|---|
| 7,879,688 B2* | 2/2011 | Novack et al. ............ | 438/458 |
| 2003/0031952 A1* | 2/2003 | Harada et al. ............ | 430/270.1 |
| 2004/0180988 A1* | 9/2004 | Bernius et al. ............ | 523/160 |
| 2005/0026662 A1 | 2/2005 | Fechner et al. | |
| 2006/0011909 A1 | 1/2006 | Kelley et al. | |
| 2006/0060841 A1* | 3/2006 | Kim et al. ............ | 257/40 |
| 2006/0060857 A1* | 3/2006 | Mardilovich et al. ............ | 257/66 |
| 2006/0097249 A1* | 5/2006 | Kim et al. ............ | 257/40 |
| 2006/0180809 A1* | 8/2006 | Park et al. ............ | 257/40 |

(Continued)

FOREIGN PATENT DOCUMENTS
EP    1489141    12/2004
(Continued)

OTHER PUBLICATIONS
Gross, S., et al. "Dielectric Investigation of Inorganic-Organic Hybrid Film Based on Zirconium Oxocluster-Crosslinked PMMA." J. Non-Cryst. Sol., vol. 322 (2003): pp. 154-159.*

*Primary Examiner* — Matthew W Such
(74) *Attorney, Agent, or Firm* — Ladas & Parry LLP

(57) ABSTRACT

Provided is an insulating layer in which an inorganic material is added to an organic polymer to thereby improve the insulating properties, an organic thin film transistor using the insulating layer, and a method of fabricating the organic thin film transistor. An insulating layer for an organic thin film transistor including a vinyl polymer and an inorganic material is provided. Here, a weight ratio of the vinyl polymer to the inorganic material may be in the range of 1:0.0001 to 1:0.5. Accordingly, it is possible to fabricate a thin film at low temperature and, further, to fabricate an insulating layer having a high-dielectric constant, not affecting other layers formed in the previous processes during the formation of the insulating layer.

12 Claims, 2 Drawing Sheets

U.S. PATENT DOCUMENTS

| | | | |
|---|---|---|---|
| 2007/0085071 A1* | 4/2007 | Kim et al. | 257/40 |
| 2007/0126002 A1* | 6/2007 | Moriya et al. | 257/40 |
| 2008/0017848 A1* | 1/2008 | Maliakal | 257/40 |

FOREIGN PATENT DOCUMENTS

| | | |
|---|---|---|
| JP | 10-190001 | 7/1998 |
| KR | 1998-0080190 | 11/1998 |
| KR | 1020000045272 | 7/2000 |
| KR | 1020020084376 | 11/2002 |
| KR | 1020030016981 | 3/2003 |
| KR | 1020040028010 | 4/2004 |
| KR | 1020050123332 | 12/2005 |
| KR | 1020060037732 | 5/2006 |

\* cited by examiner

INSULATING LAYER, ORGANIC THIN FILM TRANSISTOR USING THE INSULATING LAYER, AND METHOD OF FABRICATING THE ORGANIC THIN FILM TRANSISTOR

CROSS-REFERENCE TO RELATED APPLICATION

This application claims priority to and the benefit of Korean Patent Application No. 2006-0087258, filed Sep. 11, 2006, the disclosure of which is incorporated herein by reference in its entirety.

BACKGROUND

1. Field of the Invention

The present invention relates to an insulating layer used for an organic thin film transistor, an organic thin film transistor using the insulating layer, and a method of fabricating the organic thin film transistor, and more particularly, to an insulating layer in which an inorganic material is added to an organic polymer to thereby improve the insulating properties, an organic thin film transistor using the insulating layer, and a method of fabricating the organic thin film transistor.

2. Discussion of Related Art

An organic thin film transistor is a device that uses an organic material as an active layer. Research into organic thin film transistors began in the 1980s and continues today in laboratories all over the world. The organic thin film transistor is similar to a silicon thin film transistor (Si-TFT) in structure, but makes use of organic material instead of silicon in an active semiconductor region, and may use organic material for an insulating layer as well.

Unlike the conventional Si-thin film transistor, the organic thin film transistor has the advantage of a thin film that can be formed by means of a wet process performed at atmospheric pressure, for example, a printing coating process, a spin coating process, a bar coating process, etc. Also, the thin film may be continuously fabricated by a roll-to-roll method to produce thin film transistors at low cost.

The performance of the organic thin film transistor is influenced by the degree of crystallization of an organic active layer, an interfacial charge characteristic between an organic insulating layer and an organic active layer, a thin film characteristic of the organic insulating layer, carrier injection capability at interfaces between source and drain electrodes and the organic active layer, and so forth. Accordingly, research aimed at improving these characteristics is underway.

In particular, in order for an organic insulating layer to be used in a device requiring a high driving voltage, it is necessary to develop material having a high-dielectric constant and a method of fabricating the material.

SUMMARY OF THE INVENTION

The present invention is directed to an insulating layer having improved insulating properties by changing materials constituting a conventional insulating layer, an organic thin film transistor having the insulating layer, and a method of fabricating the organic thin film transistor.

One aspect of the present invention provides an insulating layer for an organic thin film transistor including a vinyl polymer and an inorganic material. Here, a weight ratio of the vinyl polymer to the inorganic material may be 1:0.0001 to 1:0.5.

Another aspect of the present invention provides an organic thin film transistor including an insulating layer disposed between first and second layers, wherein the insulating layer includes a vinyl polymer and an inorganic material.

Yet another aspect of the present invention provides a method of fabricating an organic thin film transistor including an insulating layer disposed between first and second layers, including the steps of: coating an insulating solution including a vinyl monomer and an inorganic material on the first layer; and polymerizing the insulating solution coated on the first layer.

BRIEF DESCRIPTION OF THE DRAWINGS

The above and other objects, features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Figure 1:
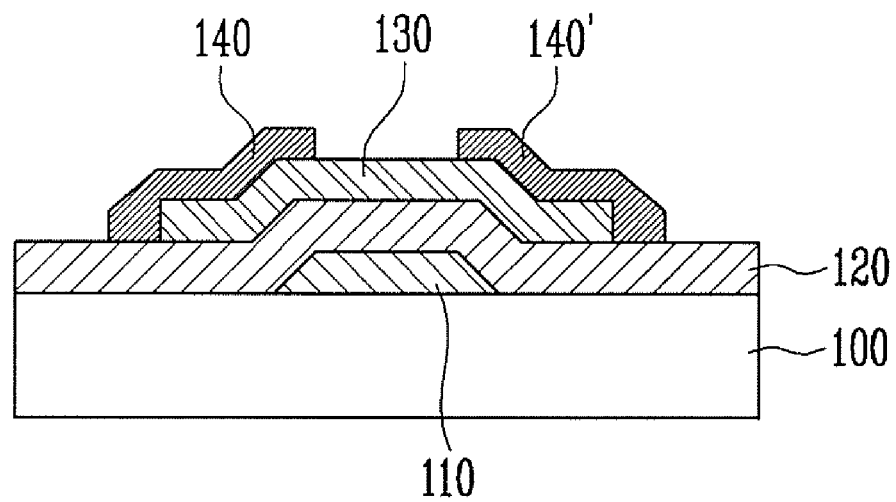
FIG. 1 is a cross-sectional view of an organic thin film transistor having an inverted staggered structure according to an exemplary embodiment of the present invention.

An insulating layer and an organic thin film transistor according to an exemplary embodiment of the present invention will be described below with reference to the accompanying drawings. FIG. 1 is a cross-sectional view of an organic thin film transistor having an inverted staggered structure.

In the organic thin film transistor having the inverted staggered structure of FIG. 1, a gate electrode 110 is formed on a region of a substrate 100, a gate insulating layer 120 is formed on the gate electrode 110 and the substrate 100, an organic semiconductor layer 130 is formed on a region of the gate insulating layer 120 corresponding to the gate electrode 110, and at least one part of each source and drain electrode 140 and 140' is formed on the organic semiconductor layer 130.

Here, the gate electrode 110 includes a vinyl polymer and an inorganic material, and a weight ratio of the vinyl polymer to the inorganic material may be 1:0.0001 to 1:0.5. This is because when the weight ratio of the inorganic material is less than 0.0001, properties are not secured. Also, when the weight ratio is more than 0.5, surface properties are deteriorated. The vinyl polymer may include at least one of acrylic vinyl monomer, aromatic vinyl monomer, acrylonitrile vinyl monomer, chloride vinyl monomer, vinyl stearate monomer, and vinyl propionate monomer.

The acrylic vinyl monomer may include at least one of Triethylopropane triacrylate (TMPTA), Tri(propylene glycol) diacrylate (TPGDA), Penthaerithritol triacrylate (PETA), Trimethylolpropane ethoxylate triacrylate (TMPEOTA), Methyl methacrylate (MMA), Methacrylate (MA), Tri(propylene glycol) glycerolate diacrylate (TPGGDA), Vinylacrylate (VA), Benzyl methacrylate (BA), Isobornyl acrylate (IA) and Glycidyl methacrylate (GA).

The aromatic vinyl monomer may include styrene or divinyl benzene.

The chloride vinyl monomer may include vinylidene chloride or vinyl benzene chloride.

Meanwhile, the insulating layer may further include polymerization products of oligomers included during polymerization reaction. The content of the polymerization products of oligomers may be between 1 and 80 wt % of the total weight of the insulating layer, and a molecular weight of the oligomers may be in the range of 300 to 20000.

This is because when the amounts are less than 1 wt %, the properties are not secured, and when the amounts are more than 80 wt %, optical patterns are not formed.

The oligomers may include urethane acrylate oligomers, acrylate oligomers, ether acrylate oligomers, epoxy acrylate oligomers or a mixture thereof.

The inorganic material may be composed of $BaTiO_3$, $SrTiO_3$, $TiO_2$, $SiO_2$, ITO, Aluminum Tin Oxide, Indium Tin Oxide (ITO) or Ag. Also, a diameter of the inorganic material may be in the range of 0.01 to 1.0 μm. This is because it is difficult to form the inorganic material with a diameter of less than 1.0 μm. Also, if the diameter of the inorganic material is more than 1.0 μm, it is difficult to fabricate a thin film, and applications are limited.

Figure 2:
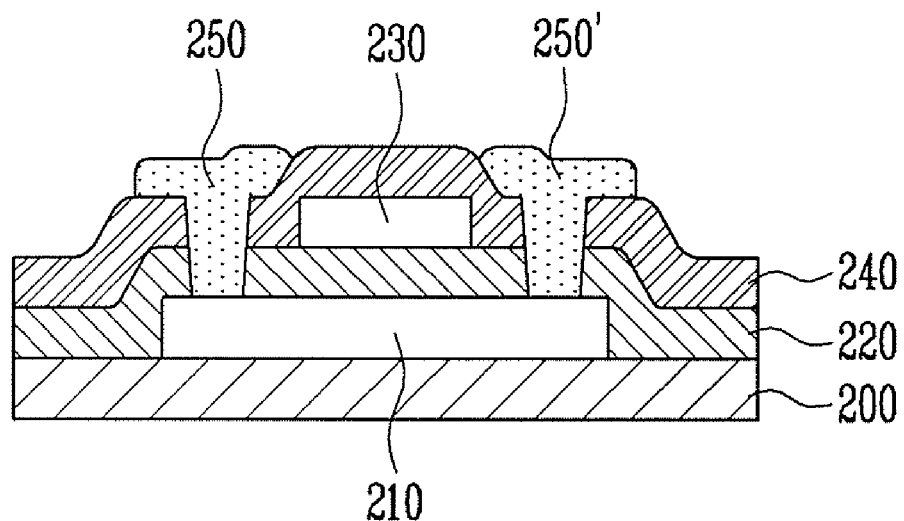
FIG. 2 is a cross-sectional view of an organic thin film transistor having a coplanar structure according to an exemplary embodiment of the present invention.

FIG. 2 is a cross-sectional view of an organic thin film transistor having a coplanar structure. Referring to the FIG. 2, an organic semiconductor layer 210 is formed on a region of a substrate 200, a gate insulating layer 220 is formed on the organic semiconductor layer 210, a gate electrode 230 is formed on a region of the gate insulating layer 220 corresponding to the organic semiconductor layer 210, an interlayer insulating layer 240 is further formed on the gate electrode 230, and source and drain electrodes 250 and 250' are respectively formed on the interlayer insulating layer 240 to be in contact with the organic semiconductor layer 210 through contact holes formed to expose predetermined regions of the organic semiconductor layer 210.

Here, the insulating layer 220 and the interlayer insulating layer 240 include a vinyl polymer and an inorganic material, and a weight ratio of the vinyl polymer to the inorganic material may be 1:0.0001 to 1:0.5. When the weight ratio of the inorganic material is less than 0.0001, the properties are not secured, and when the weight ratio is more than 0.5, surface properties are deteriorated.

The gate insulating layer 220 and the interlayer insulating layer 240 used in a coplanar structure can be formed in the same configuration as the gate insulating layer for the inverted staggered structure. Therefore, a detailed description thereof will be omitted.

A method of fabricating an organic thin film transistor according to an exemplary embodiment of the present invention will be described below.

FIGS. 3A to 3D are cross-sectional views sequentially illustrating a fabrication method of an organic thin film transistor having an inverted staggered structure according to an exemplary embodiment of the present invention. The fabrication method includes the steps of forming a gate electrode on a substrate, forming a gate insulating layer, forming an organic semiconductor layer on the insulating layer, and forming an electrode consisting of an inorganic material doped with impurities on the organic semiconductor layer. In order for disclosures of the present invention to be complete, the fabrication method (excluding forming the gate insulating layer) will be briefly described.

Figure 3A:
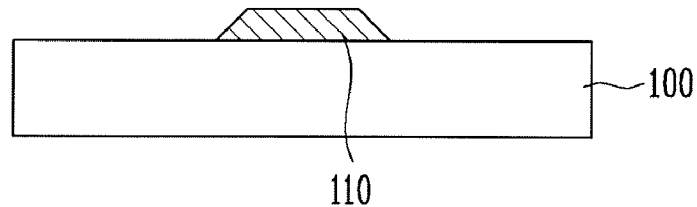
FIGS. 3A to 3D are cross-sectional views sequentially illustrating a process of fabricating an organic thin film transistor having an inverted staggered structure according to an exemplary embodiment of the present invention.

A gate electrode 110 is formed on a substrate 100 using an etching method, a lift-off method, etc., in the step of forming the gate electrode (FIG. 3A).

Figure 3B:
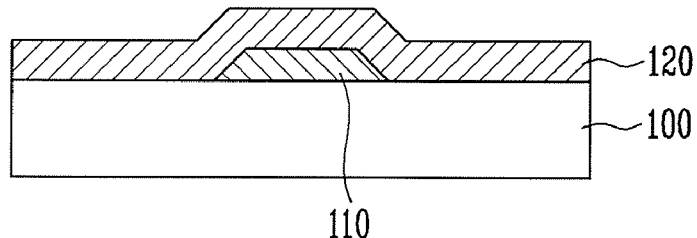

Sequentially, a gate insulating layer 120 insulating the gate electrode 100 from an upper layer is formed in the step of forming the gate insulating layer (FIG. 3B). An organic material constituting the gate insulating layer 120 is applied on the gate electrode 110 and the substrate 100 using methods such as spin coating, bar coating, spreading, dipping, etc.

Here, the organic material constituting the applied gate insulating layer 120 further includes a single molecule in liquid or oligomer to be polymerized after being applied thereto. As a polymerization initiator, a thermal initiator, a photoinitiator, and an initiator using redox reaction may be used Here, the thermal initiator may employ one of Benzoyl peroxide (BP), Acetyl peroxide (AP), Diauryl peroxide (DP), Di-tert-butyl peroxide (t-BTP), Cumyl hydroperoxide (CHP), Hydrogen peroxide (HP), Potassium peroxide (PP), 2,2'Azobisisobutyronitrile (AIBN), Azocompound, and Silver alkyls. When the thermal initiator is used as the polymerization initiator, the organic material applied thereto is subjected to an annealing process to form an organic polymer layer.

Also, the photoinitiator may employ one of 1-Hydroxycyclohexyl-phenyl-ketone (Irgacure 907), 2-Methyl-1[4-(methylthio)phenyl]-2-morpholinopropane-1-one (Irgacure 184C), 1-Hydroxy-2-methyl-1-phenyl-propane-1-one (Darocur 1173), Irgacure 500 in which Irgacure 184C 50 wt % is mixed with Benzophenone 50 wt %, Irgacure 1000 in which Irgacure 184C 20 wt % is mixed with Irgacure 1173 80 wt %, 2-Hydroxy-1-[4-(2-hydroxyethoxy)phenyl]-2-methyl-1propanone (Irgacure 2959), Methylbenzoylformate (Darocur MBF), Alpha, alpha-dimethoxy-alpha-phenylacetophenone (Irgacure 651), 2-Benzyl-2-(dimethylamino)-1-[4-(morpholinyl)phenyl]-1-butanone (Irgacure 369), Irgacure 1300 in which Irgacure 369 30 wt % is mixed with Irgacure 651 70 wt %, Diphenyl (2,4,6-trimethylbenzoyl)-phosphine oxide (Darocur TPO), Darocur 4265 in which Darocur TPO 50 wt % is mixed with Darocur 1173 50 wt %, Phosphine oxide, phenyl bis(2,4,6-trimethyl benzoyl) (Irgacure 819), Irgacure 2005 in which Irgacure 819 5 wt % is mixed with Darocur 1173 95 wt %, Irgacure 2010 in which Irgacure 819 10 wt % is mixed with of Darocur 1173 90 wt %, Irgacure 2020 in which Irgacure 819 20 wt % is mixed with Darocur 1173 80 wt %, Bis(.eta.5-2,4-cyclopentadien-1-yl) bis[2,6-difluoro-3-(1H-pyrrol-1-yl)phenyl]titanium (Irgacure 784), and an mixed initiator containing benzophenone (HSP 188 available from SK CYTEC of Republic of Korea). When the photoinitiator is used for polymerization, a beam is irradiated to the organic material applied thereto to form an organic polymer layer.

Also, persulfates ($K_2S_2O_8$) or a redox initiator may be used as the initiator using the redox reaction.

Figure 3C:
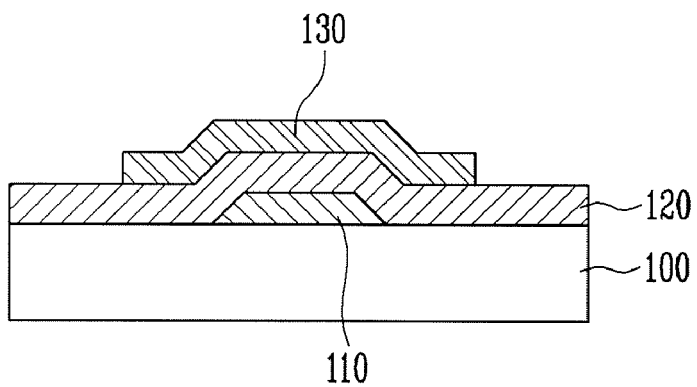

The step of forming the organic semiconductor layer is to form an organic semiconductor layer 210 that constitutes a channel connecting source and drain electrodes using printing coating, spin coating, or bar coating (FIG. 3C).

Figure 3D:
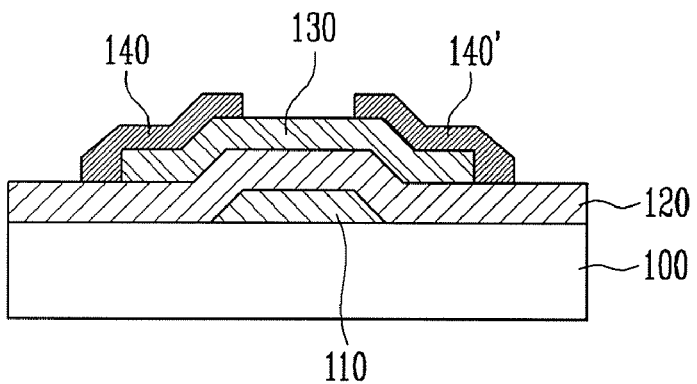

The step of forming the electrode is to form source and drain electrodes 140 and 140' at both ends of the organic semiconductor layer 210, in which the source and drain electrodes are patterned to form an organic thin film transistor (FIG. 3D).

Meanwhile, a test for examining dielectric properties of a gate insulating layer according to the present invention was performed to thereby examine a capacitance-frequency curve. Values of dielectric constant and dielectric loss of the gate insulating layer calculated from the test results are shown in Tables 1 and 2.

TABLE 1

Electrical characteristics of poly (vinyl alcohol) doped with TiO₂ inorganic particles

| Density of TiO₂ inorganic particles (wt %) | Thickness (Å) | Dielectric Constant (@1 MHz) |
|---|---|---|
| 0 | 3720 | 4.4 |
| 3 | 4120 | 5.1 |
| 5 | 4230 | 5.7 |
| 7 | 4310 | 6.0 |

TABLE 2

Electrical characteristics of poly (vinyl alcohol) doped with BaTiO₃ inorganic particles

| Density of BaTiO₃ inorganic particles (wt %) | Thickness (Å) | Dielectric Constant (@1 MHz) |
|---|---|---|
| 0 | 3720 | 4.4 |
| 5 | 5210 | 6.0 |
| 10 | 4850 | 9.1 |

It can be seen from Tables 1 and 2 that the dielectric constant of the insulating layer is increased in proportion to the amounts of $TiO_2$ and $BaTiO_3$ added.

According to an insulating layer used for an organic thin film transistor, an organic thin film transistor using the insulating layer, and a method of fabricating the organic thin film transistor of the present invention, by adding an inorganic material to a vinyl polymer, it is possible to fabricate a thin film at low temperature and, further, to fabricate an insulating layer having a high-dielectric constant, not affecting other layers formed in the previous processes during the formation of the insulating layer. Moreover, the insulating layer of the present invention can be applied to other thin film transistors of various shapes. In addition, since the insulating layer of the present invention is formed by a wet process, it is possible to fabricate the organic TFT on a large-area substrate.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating an organic thin film transistor comprising an insulating layer disposed between first and second layers, the method comprising the steps of:
    coating the first layer with an insulating solution comprising a vinyl monomer, reactive oligomers, and an inorganic material; and
    forming the insulating layer for the organic thin film transistor comprising a vinyl polymer and an inorganic material by polymerizing the insulating solution coated on the first layer,
    wherein the molecular weight of the oligomers ranges from 300 to 20,000, and wherein the oligomer comprises one selected from the group consisting of urethane acrylate oligomer, acrylate oligomer, ether acrylate oligomer, and epoxy acrylate oligomer, or a mixture thereof.

2. The method of claim 1, wherein, in the polymerizing step, a photoinitiator is used for polymerization, and a beam is irradiated onto the insulating solution.

3. The method of claim 2, wherein the photoinitiator is one selected from the group consisting of 1-Hydroxy-cyclohexyl-phenyl-ketone, 2-Methyl-1[4-(methylthio)phenyl]-2-morpholinopropane-1-one, 1-Hydroxy-2-methyl-1-phenyl-propane-1-one, 2-Methyl-1-[4-(methylthio)phenyl]-2-morpholinopropane-1-one 50 wt % mixed with Benzophenone 50 wt %, 2-Methyl-1[4-(methylthio)phenyl]-2-morpholinopropane-1-one 20 wt % mixed with 1-Hydroxy-2-methyl-1-phenyl-propane-1-one 80 wt %, 2-Hydroxy-1-[4-(2-hydroxyethoxy)phenyl]-2-methyl-1propanone, Methylbenzoylformate, Alpha, alpha-dimethoxy-alpha-phenylacetophenone, 2-Benzyl-2-(dimethylamino)-1-[4-(morpholinyl) phenyl]-1-butanone, 2-Benzyl-2-(dimethylamino)-1-[4-(morpholinyl) phenyl]-1-butanone 30 wt % mixed with Alpha, alpha-dimethoxy-alpha-phenylacetophenone 70 wt %, Diphenyl (2,4,6-trimethylbenzoyl)-phosphine oxide, Diphenyl (2,4,6-trimethylbenzoyl)-phosphine oxide 50 wt % mixed with 1-Hydroxy-2-methyl-1-phenyl-propane-1-one 50 wt %, Phosphine oxide, phenyl bis(2,4,6-trimethyl benzoyl), phenyl bis(2,4,6-trimethyl benzoyl) 5 wt % mixed with 1-Hydroxy-2-methyl-1-phenyl-propane-1-one 95 wt %, phenyl bis(2,4,6-trimethyl benzoyl) 10 wt % is mixed with 1-Hydroxy-2-methyl-1-phenyl-propane-1-one 90 wt %, Irgacure 2020 in which Irgacure 819 phenyl bis(2,4,6-trimethyl benzoyl) 20 wt % mixed with 1-Hydroxy-2-methyl-1-phenyl-propane-1-one 80 wt %, Bis(.eta.5-2,4-cyclopentadien-1-yl) bis[2,6-difluoro-3-(1H-pyrrol-1-yl)phenyl]titanium, and a mixed initiator containing benzophenone.

4. The method of claim 1, wherein, in the polymerizing step, a thermal initiator is used for polymerization, and heat is applied to the insulating solution.

5. The method of claim 4, wherein the thermal initiator is one selected from the group consisting of Benzoyl peroxide (BP), Acetyl peroxide (AP), Diauryl peroxide (DP), Di-tert-butyl peroxide (t-BTP), Cumyl hydroperoxide (CHP), Hydrogen peroxide (HP), Potassium peroxide (PP), 2,2'Azo-bisisobutyronitrile (AIBN), Azocompound, and Silver alkyls.

6. The method of claim 1, wherein, in the polymerizing step, an initiator using redox reactions is used for polymerization.

7. The method of claim 6, wherein the initiator using the redox reactions is potassium persulfate or a redox initiator.

8. The method of claim 1, wherein a weight ratio of the vinyl polymer to the inorganic material is 1:0.0001 to 1:0.5.

9. The method of claim 1, wherein the vinyl polymer is a polymer of a monomer selected from the group consisting of acrylic vinyl monomer, aromatic vinyl monomer, acrylonitrile vinyl monomer, chrolide vinyl monomer, vinyl stearate monomer, and vinyl propionate monomer.

10. The method of claim 9, wherein the acrylic vinyl monomer comprises one selected from the group consisting of Triethylopropane triacrylate (TMPTA), Tri(propylene glycol) diacrylate (TPGDA), Penthaerithritol triacrylate (PETA), Trimethylolpropane ethoxylate triacrylate (TMPEOTA), Methyl methacrylate (MMA), Methacrylate (MA), Tri(propylene glycol) glycerolate diacrylate (TPGGDA), Vinylacrylate (VA), Benzyl methacrylate (BA), Isobornyl acrylate (IA) and Glycidyl methacrylate (GA), or a mixture thereof.

11. The method of claim 1, wherein the inorganic material comprises one selected from the group consisting of $BaTiO_3$, $SrTiO_3$, $TiO_2$, $SiO_2$, ITO, Aluminium Tin Oxide, Indium Tin Oxide (ITO), and Ag.

12. The method of claim 1, wherein the inorganic material comprises a particle having a diameter of 0.01 to 1.0 μm.

* * * * *